United States Patent [19]
Suominen et al.

[11] Patent Number: 5,926,513
[45] Date of Patent: Jul. 20, 1999

[54] RECEIVER WITH ANALOG AND DIGITAL CHANNEL SELECTIVITY

[75] Inventors: Edwin A. Suominen, Phoenix; Charles J. Voboril, Fountain Hills, both of Ariz.

[73] Assignee: Alcatel Alsthom Compagnie Generale d'Electricite, Paris, France

[21] Appl. No.: 08/788,241

[22] Filed: Jan. 27, 1997

[51] Int. Cl.[6] .............................. H04B 1/10; H03D 1/04
[52] U.S. Cl. ........................................... 375/346; 375/350
[58] Field of Search ................................... 375/316, 350, 375/229, 285; 455/130

[56] References Cited

U.S. PATENT DOCUMENTS

| | | | |
|---|---|---|---|
| 4,551,688 | 11/1985 | Craiglow | 330/280 |
| 4,803,700 | 2/1989 | Dewey et al. | 375/77 |
| 4,893,316 | 1/1990 | Janc et al. | 375/261 |
| 4,972,455 | 11/1990 | Phillips et al. | 379/59 |
| 5,020,092 | 5/1991 | Phillips et al. | 379/59 |
| 5,052,027 | 9/1991 | Poklemba et al. | 375/103 |
| 5,375,146 | 12/1994 | Chalmers | 375/103 |
| 5,396,520 | 3/1995 | Degges | 375/316 |
| 5,537,435 | 7/1996 | Carney et al. | 375/232 |
| 5,619,536 | 4/1997 | Gourgue | 375/316 |
| 5,640,416 | 6/1997 | Chalmers | 375/350 |
| 5,640,698 | 6/1997 | Shen et al. | 375/316 |
| 5,661,487 | 8/1997 | Targoff | 342/101 |
| 5,874,414 | 7/1998 | Bruekers | 375/350 |

OTHER PUBLICATIONS

"Intelligent Digital Enhanced Communications System, TS–870S HF Transceiver," Kenwood In–Depth Manual, date unknown, pp. 4–15, Appendix, pp. 24–2.

Undersampling Techniques Simplify Digital Radio by Richard Groshong & Stephen Ruscak Electronic Design, May 23, 1991, pp. 3–95–3–101.

*Primary Examiner*—Tesfaldet Bocure
*Attorney, Agent, or Firm*—Ware, Fressola, Van Der Sluys & Adolphson LLP

[57] ABSTRACT

A radio receiver for receiving radio frequency (RF) signals includes an analog down-converting and filtering section for down-converting and selecting the RF signals to an intermediate passband and a stopband which substantially determine the widest bandwidth of operation of the radio receiver. An analog-to-digital converter converts the intermediate frequency signal to a sampled digital signal. A digital filtering section, responsive to the sampled digital signal, includes wideband and narrowband digital filters for providing wide bandwidth and narrow bandwidth baseband quadrature output signals for the widest bandwidth of operation and a narrow bandwidth of operation at a frequency within a passband. The wideband digital filtering is designed to only provide a modest amount of additional stopband attenuation with a significantly sharper transition band rolloff from passband to stopband. When this limited digital filtering is applied to the signal that has already been subjected to the analog filtering, the selectivity of the overall receiver frequency response is improved. The receiver may be used for multi-bandwidth operation by simply adding digital filtering to define any narrower passband of interest. This allows bandwidth switching to take place without any changes to the analog circuitry. Simultaneous processing of both wide and narrow modes of operation may be done in the digital signal processor (DSP) performing the digital filtering.

25 Claims, 12 Drawing Sheets

RECEIVER WITH ANALOG AND DIGITAL CHANNEL SELECTIVITY

TECHNICAL FIELD

This invention relates to radio receivers, and more particularly to a radio receiver having improved channel selectivity.

BACKGROUND OF THE INVENTION

Before the advent of digital signal processing (DSP), all selectivity in a GS a radio receiver was provided by analog filters. The signal, or pass)(band, of interest was selected by analog filter devices that attenuated all other signals. These analog filter devices typically take the form of crystal networks, ceramic resonators, and more recently, Surface Acoustic Wave (SAW) devices.

Receivers using only analog signal processing are still common because of cost considerations. Digital channel filtering can be computationally expensive if it seeks to duplicate the high level of undesired signal rejection available in analog filters. A multi-bandwidth receiver using only analog filtering is described in U.S. Pat. No. 5,020,092. This receiver has two bandwidth settings which are selectable by applying the signal of interest to one of two analog filters.

As DSP costs decline, more of the channel filtering is being done with digital processing. Some solutions use almost exclusively digital processing. For example, a "Digital Downconverter" IC (HSP50016) manufactured by Harris Corp. provides all of the stopband rejection within many megahertz of the signal of interest. This is a computationally expensive solution because it requires the digital filtering to completely define the stopband at a high sample rate. It requires on-chip DSP hardware dedicated to performing the required high-rate, high-order filtering.

The combination of older analog filtering with newer digital filtering is known. U.S. Pat. No. 4,803,700, for example, teaches this combination for use in a single-bandwidth receiver, where the ultimate rejection of the stopband is defined, at various frequencies, by both analog and digital filtering for this single bandwidth. The stopband of the digital filtering still needs to be very well-defined This patent does not teach multi-bandwidth operation and is not well suited for that mode of use.

The replacement of the second intermediate frequency (IF) filter (usually 450 or 455 kHz) with DSP filtering to make multi-bandwidth operation easier is also known. Such a configuration is described in Application Note AN-301, published by Analog Devices, Inc. This configuration does not use an analog filter to define the stopband of the passband of interest. Thus, no consequent reduction in DSP processing is realized.

There therefore exists a need for a low cost, high quality selectivity radio receiver wherein multiple passbands of interest are selectively defined. It would be desirable if such a receiver could utilize the low cost selectivity associated with an analog filter with the improved frequency response associated with a digital filter.

SUMMARY OF THE INVENTION

Objects of the invention include the provision of a radio receiver having low cost, high quality selectivity for multiple passbands of interest.

A further object of the invention is to provide such a radio receiver which utilizes the low cost selectivity associated with analog filtering in combination with improved frequency response provided by digital filtering.

A still further object of the invention is to provide such a radio receiver wherein the closest alias is separated from the signal of interest by several analog filter bandwidths to thereby improve signal quality.

Another object of the invention is to provide such a multi-bandwidth receiver where the additional selectivity of a narrower bandwidth setting is implemented by additional digital filtering with no changes to the analog signal processing.

According to the present invention, a radio receiver for receiving radio frequency signals includes an analog down-converting and filtering section, responsive to the received radio frequency signals, for down-converting and selecting the received radio frequency signals to an intermediate frequency signal having a frequency within a frequency range of interest, the frequency range of interest having a passband and a stopband which substantially determine the widest bandwidth of operation of the radio receiver; an analog-to-digital converter for converting the intermediate frequency signal to a sampled digital signal; and a digital filtering section including wideband digital filters for providing wide bandwidth baseband quadrature output signals for a wide bandwidth of interest within the frequency range of interest and narrowband digital filters, responsive to the wideband baseband quadrature output signals, for providing narrow bandwidth baseband quadrature output signals for a narrow bandwidth of interest within the frequency range of interest. The combination of analog filters defines a frequency range of interest, the frequency range of interest being further defined with a limited amount of digital filtering. The digital filtering is designed to only provide a modest amount of additional stopband attenuation with a significantly sharper transition band rolloff from the passband to this stopband. When this limited digital filtering is applied to the signal that has already been subjected to the analog filtering, the selectivity of the overall receiver frequency response is improved.

The digital filtering also serves to limit aliased noise. Without it, the of quantization noise generated after the analog filtering would alias into the passband of interest. For frequencies that are several bandwidths away from the signal of interest, the analog filtering will almost completely define the undesired signal rejection. At these frequencies, the digital filtering only needs to attenuate the quantization noise. The attenuation is just enough to prevent significant degradation of the overall noise figure.

According further to the present invention, the digital filtering section further includes a first digital filtering stage, responsive to the sampled digital signal, for providing quadrature-related output signals, and a numerically controlled oscillator and modulator, responsive to the quadrature-related output signals, for shifting a frequency of said quadrature-related output signals to baseband, thereby providing baseband quadrature signals to the wideband digital filters. The first digital filtering stage implements, in part, a moving average having unity weighting coefficients which have been modulated by a complex exponential to thereby shift the center frequency of the first digital filtering stage from baseband to a center frequency of a signal of interest.

In further accord with the invention, the analog filtering provides more than fifty percent (50%) of the signal rejection of the receiver, and the processing burden of the digital filtering is considerably reduced because the analog filtering establishes the basic bandwidth and ultimate rejection. This allows the digital filtering to efficiently sample the signal of interest at a high rate relative to its bandwidth. This lowers the level of quantization noise in the passband of the signal of interest by spreading the quantization noise energy across a wider frequency spectrum.

The high sampling rate also moves the closest alias further away from the signal of interest, so that the alias can be better rejected by the analog filtering.

The analog filtering has good ultimate signal rejection, but its frequency response rolls off gradually to this ultimate level. Thus the higher sampling frequency of the digital filtering helps the anti-aliasing function of the analog filtering. Utilizing the analog filtering to provide more than half of the receiver signal rejection allows the digital filtering to be implemented utilizing a less expensive digital signal processor (DSP), thereby providing a significant advantage over the prior art.

In still further accord with the invention, the receiver may be used for multi-bandwidth operation by simply adding digital filtering to define any narrower passband of interest. The analog filtering largely defines the selectivity of the widest bandwidth of operation for the receiver. Narrower bandwidth operation relies on additional digital filtering. This allows bandwidth switching to take place without any changes to the analog circuitry. Simultaneous processing of both wide and narrow modes of operation may be done in the digital signal processor (DSP) performing the digital filtering.

The present invention provides a significant improvement over the prior art. The majority of a receiver's widest channel selectivity is defined by inexpensive analog filtering followed by limited digital filtering to compensate for imperfections and limit noise generated after the analog filter. This additional digital filtering is easily implemented with a limited stopband attenuation relative to the analog filtering that preceded it. The digital filtering is done at a fairly high sampling rate relative to the bandwidth of the received signal, so that the closest alias is separated from the signal of interest by several analog filter bandwidths. This allows the analog filtering to have wide transition band rolloff to a high level of ultimate undesired signal rejection, as is characteristic of many analog filters. The receiver may be implemented as a multi-bandwidth receiver where the additional selectivity of a narrower bandwidth setting is implemented by additional digital filtering, with no changes to the analog signal processing.

The foregoing and other objects, features and advantages of the present invention will become more apparent in light of the following detailed description of exemplary embodiments thereof as illustrated in the accompanying drawings.

DETAILED DESCRIPTION OF THE INVENTION

Figure 1:
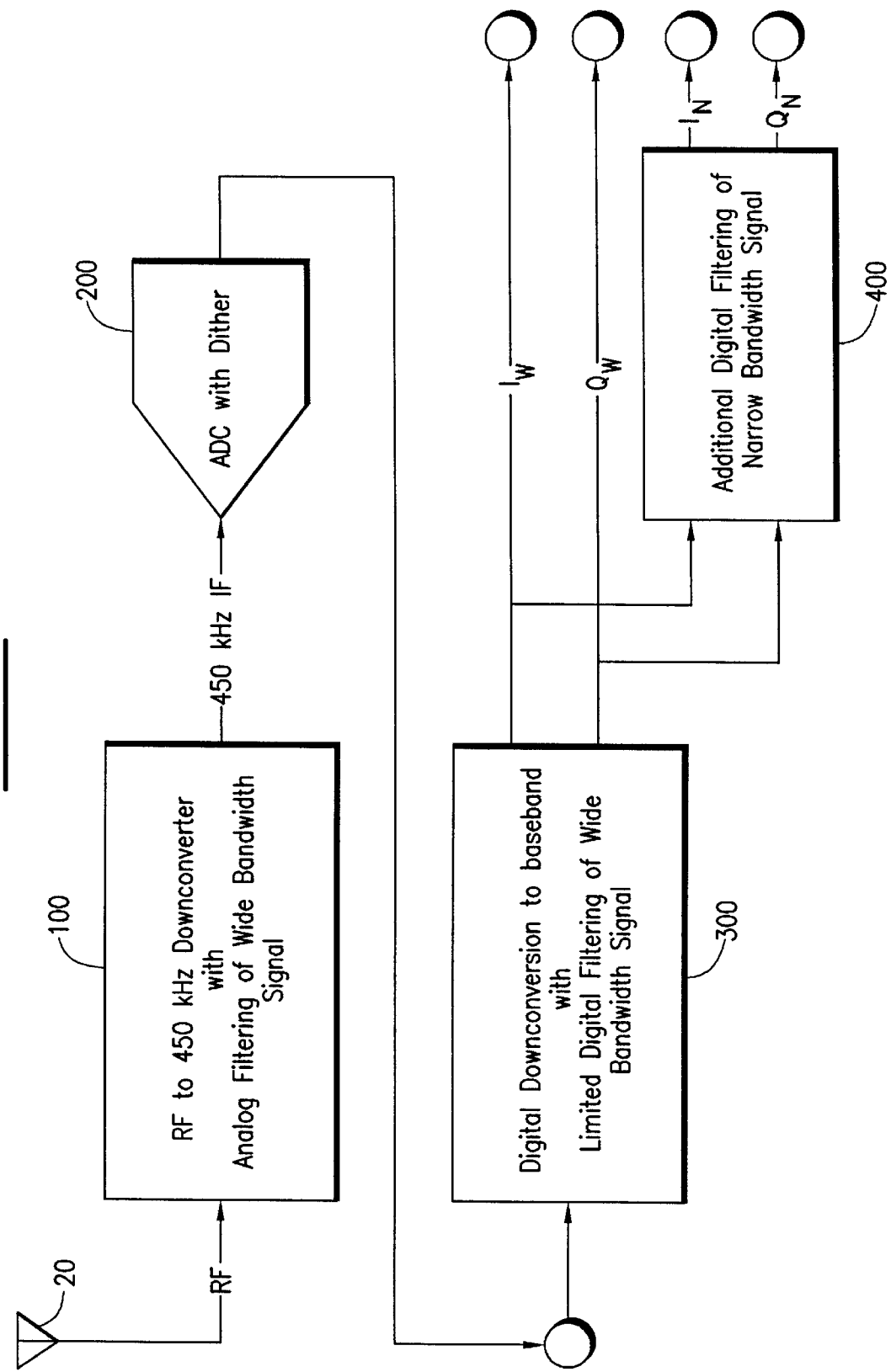
FIG. 1 is a schematic block diagram of the receiver of the invention, showing the combination of analog and digital filtering.

The radio receiver of the invention is particularly well suited for providing low cost, high quality selectivity for multiple passbands of interest. Referring to FIG. 1, a radio frequency (RF) signal from an antenna 20 is downconverted from RF to a 450 kHz second intermediate frequency (F) with a conventional analog downconverter 100. The 450 kHz downconverted signal of interest is then provided to an analog-to-digital converter (ADC) section 200, including an ADC 250, where it is converted to a sampled digital signal. The sampled digital signal is then downconverted to baseband with a digital downconverter section 300. The digital downconverter section 300 performs limited digital filtering of the signal in a wide bandwidth mode of operation. An additional digital filtering section 400 defines the selectivity of the receiver for a narrower bandwidth mode of operation. The receiver provides quadrature baseband outputs for both the wide bandwidth signal, at $I_W$ and $Q_W$, and the narrow bandwidth signal, at $I_N$ and $Q_N$.

The sections of the receiver described briefly with respect to FIG. 1 will now be described in more detail with respect to FIGS. 2 through 5. The signal flow will be described starting from the antenna 20 and concluding with the wide bandwidth output signals, $I_W$ and $Q_W$, and narrow bandwidth output signals, $I_N$ and $Q_N$.

Figure 2:
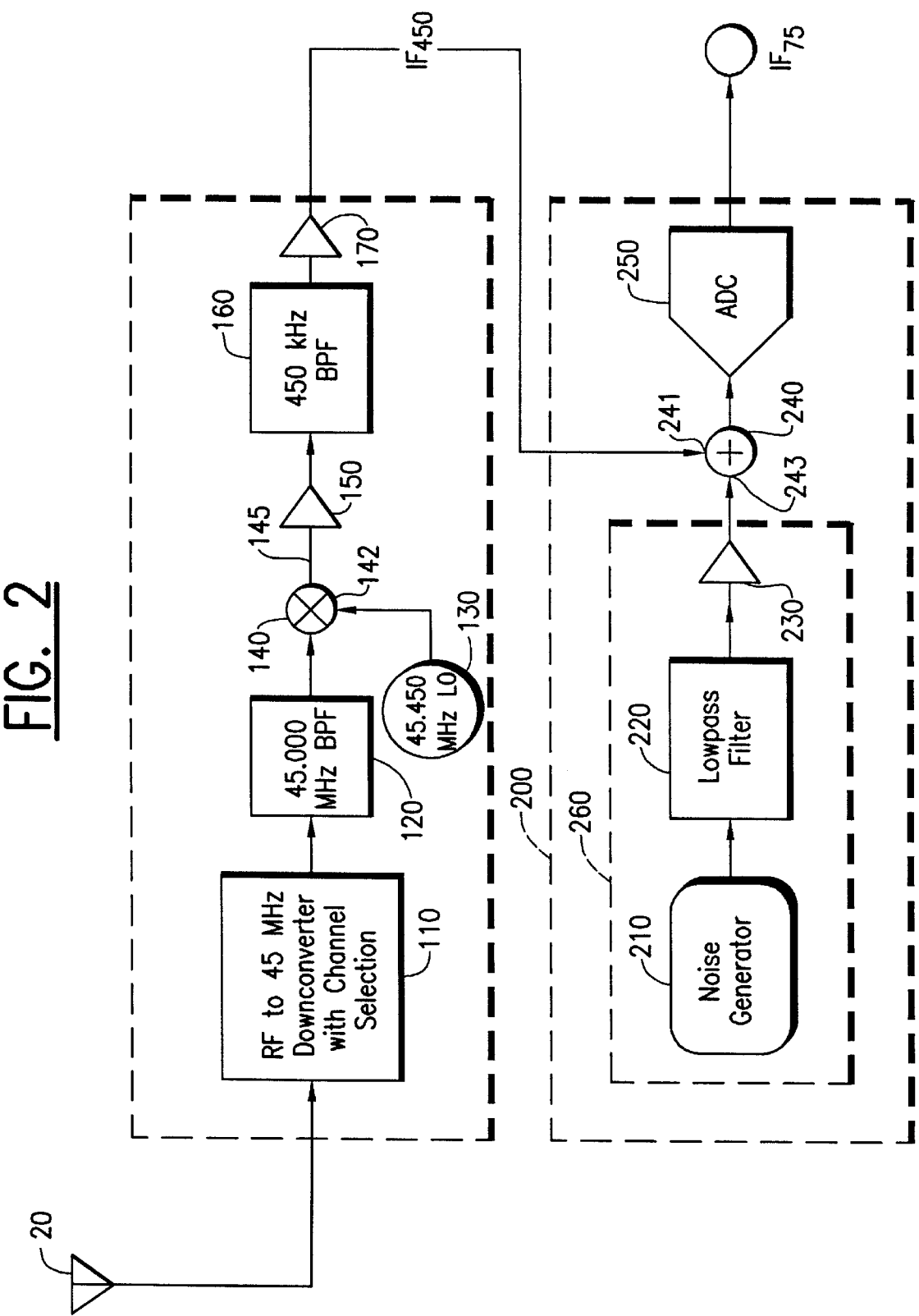
FIG. 2 is a schematic block diagram of a section of the receiver of FIG. 1 that uses analog signal processing.

Referring now to FIG. 2, the path taken by the signal from the antenna input 20 to the ADC 250 will be explained. The RF signal of interest is in this case within the cellular phone band, ranging from 824 to 849 MHZ. This signal is converted down to a 45 MHz first IF by a conventional analog downconverter 110. The downconverter 110 is tunable so that the signal of interest has a 45 MHZ difference product at the output of the downconverter 110. There will also be a sum product with a frequency of about 1700 MHz at the output of the downconverter 110.

These products are provided to a 45 MHz bandpass filter (BPF) 120. This filter 120 eliminates the sum product of the downconverter 110 and most of the undesired signal energy. The filter 120 may be a four-pole monolithic crystal filter which gradually slopes from the passband to a very high level of undesired signal rejection. The passband of this filter 120 is set equal to the widest bandwidth of operation of the receiver.

The signal is then provided to a doubly-balanced mixer 140. A local oscillator port 142 of this mixer 140 is fed by a 45.450 MHZ local oscillator (LO) 130. This local oscillator signal may be generated for example by an auxiliary synthesizer on a synthesizer IC, for example the SA7025 manufactured by Philips Semiconductors. The signal of interest appears at the output 145 of the mixer 140 as a sum and difference product having frequencies of 90.900 MHz and 450 kHz, respectively. These products are provided to an amplifier 150 and a second analog filter 160.

The 450 kHz product of mixer 140 is amplified and selected by the amplifier 150 and the second analog filter 160 while the 90.900 MHz product is rejected. The second analog filter 160 may be a six pole ceramic resonator. This type of filter has very sharp transition from its passband to a relatively shallow stopband. The combined frequency response of the first analog filter 120 and the second analog filter 160 has a relatively steep transition from the passband to a moderately deep stopband, which then rolls off gradually to a very deep ultimate rejection. The close-in stopband rejection of the receiver is improved by the digital filtering, especially filters 310a and 310b in FIG. 3, as described in greater detail herein.

The output of the second analog filter 160 is amplified by a second amplifier 170 to thereby provide a 450 kHz signal of interest, $IF_{450}$. The 450 kHz signal of interest, $IF_{450}$, is provided to one input 241 of a summing junction 240. The second amplifier 170 and the summing junction 240 are both implemented by op-amp circuits. The other input 243 to the summing junction 240 comes from a dither generator 260 made up of a white noise generator 210, a lowpass filter 220, and an amplifier 230. The output of the summing junction 240 is provided to the ADC 250.

The dither generator 260 adds a filtered noise signal to the summing junction 240 to randomize the quantization error generated by the ADC 250. Without dither, this quantization error will concentrate into distinct distortion products when multiple strong signals appear at the input of the ADC 250. The dither provided by the dither generator 260 spreads out these distortion products across the entire Nyquist bandwidth of the discrete-time system. The combination of dither and oversampling extends the dynamic range of the ADC 250 beyond its normal quantization noise floor by approximately 10 dB. This oversampling will be described below with respect to FIG. 6.

The white noise generator 210 uses a pseudorandom number generator to produce a random signal with a spectral density that extends well into the Nyquist bandwidth of the discrete-tine system. The lowpass filter 220 attenuates the noise power by the time its frequency has reached the frequency to which the signal of interest will alias when sampled by the ADC 250. The lowpass filter 220 may be implemented for example with a MAX295 eighth-order Butterworth switched-capacitor filter, manufactured by Maxim Integrated Products. The filter 220 is clocked at a rate of 1.5 MHz to have a cutoff frequency of 30 kHz.

The dithered 450 kHz signal is then sampled and converted into a binary word by the ADC 250. The ADC 250 is clocked by a 375 kHz sample clock with a serial clock frequency of 6 MHz. A suitable 12-bit ADC is the LTC1400, manufactured by Linear Technology, Inc. The 450 kHz signal is aliased to 75 kHz by the sampling operation to thereby provide a 75 kHz sampled signal $IF_{75}$. This aliasing will be described in more detailed with respect to FIG. 6. The 12-bit data word representing this aliased signal of interest is provided to the digital signal processor section 300 (FIGS. 1 and 3) where the remaining operations are performed.

Figure 3:
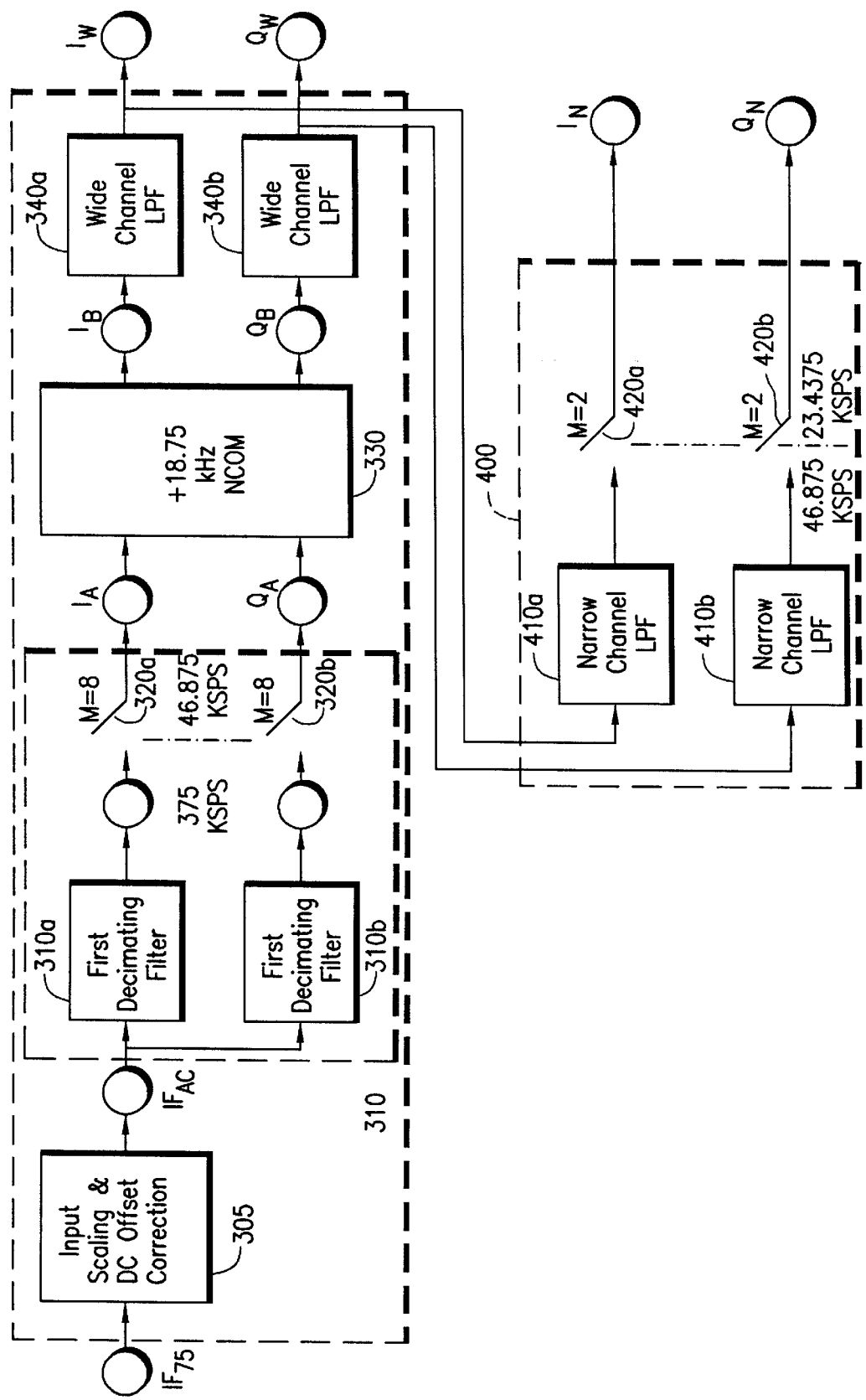
FIG. 3 is a schematic block diagram of a section of the receiver of FIG. 1 that uses digital signal processing.

Referring to FIG. 3, the digital signal processing section 300 takes $IF_{75}$, the 75 kHz alias of the 450 kHz sampled signal, down to baseband while defining the selectivity for wide bandwidth operation. The additional digital filtering 400 for narrow bandwidth operation is also shown. Because the majority of the channel selectivity is defined by the analog filtering, the digital processing may be implemented by a single digital signal processor (DSP). For example, both the digital signal processing section 300 and the additional digital filtering 400 may be implemented with an ADSP-2115, manufactured by Analog Devices, Inc.

The sampled signal $IF_{75}$ is provided to a scaling and offset correction stage 305 where the 12-bit word from the ADC 250 is scaled up to a 16-bit word representing the full numerical range of the DSP 300. Any DC offset in the signal is removed by simply adding the current sample to the inverse of the previous sample with a single-tap finite impulse response (FIR) filter. This DC offset correction stage implements a single transmission zero at DC.

The offset-corrected sampled signal $IF_{AC}$ is provided to a first digital filter 310 including a pair of decimating FIR filters 310a and 310b. These filters 310a, 310b implement a moving average (and image rejection) whose center frequency has been moved from baseband to near the 75 kHz alias of the signal of interest. The operation of these filters will be described in more detail hereinafter with respect to FIG. 4. These filters 310a, 310b produce an output for every eighth input sample. This decimation by eight is represented by decimators 320a and 320b.

The decimated output of the filters $I_A$ and $Q_A$ is a pair of quadrature-related signals. The complex-valued information conveyed by these signals is provided to a numerically controlled oscillator and modulator (NCOM) 330. This NCOM 330 shifts the frequency of the decimated output at $I_A$ and $Q_A$ to baseband. This will be described in more detail with respect to FIGS. 5 and 7. Once the signal of interest has been decimated, filtered, and shifted to baseband by the functions in blocks 310a, 310b, 320a, 320b, and 330, respectively, it can be lowpass filtered to define the passband of interest. The baseband signal paths $I_B$ and $Q_B$ are split and provided to wide channel digital filters 340a, 340b and narrow channel digital filters 410a and 410b for wide and narrow bandwidth operation, respectively.

For the narrow mode of operation, the signal is decimated by two after the narrow channel filtering is applied. The narrow channel filters 410a and 410b produce an output for every other input sample. This decimation is represented by decimators 420a and 420b.

Figure 4:
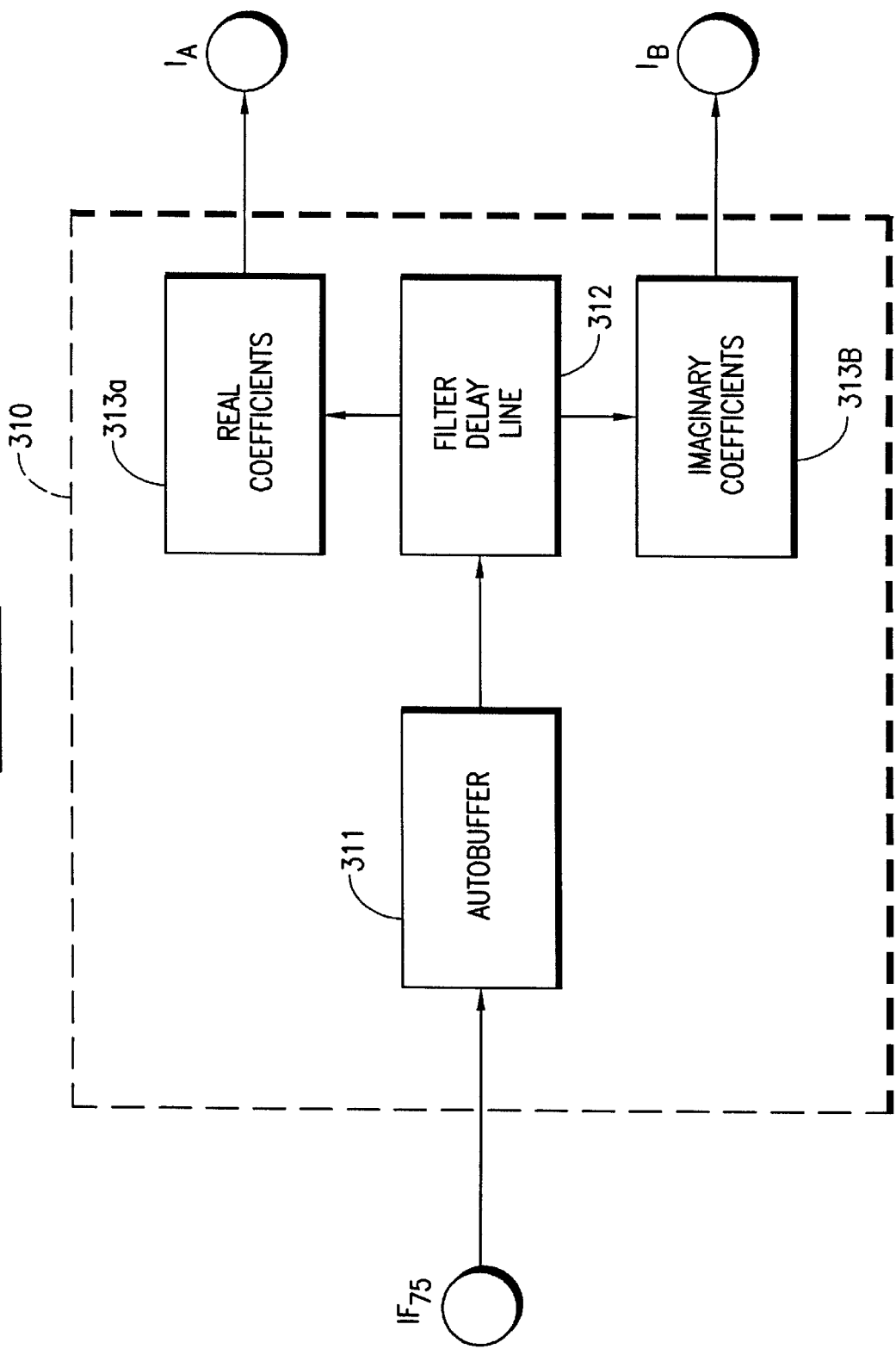
FIG. 4 is a schematic block diagram of a first digital filter used in the digital signal processing section of FIG. 3.
Figure 5:
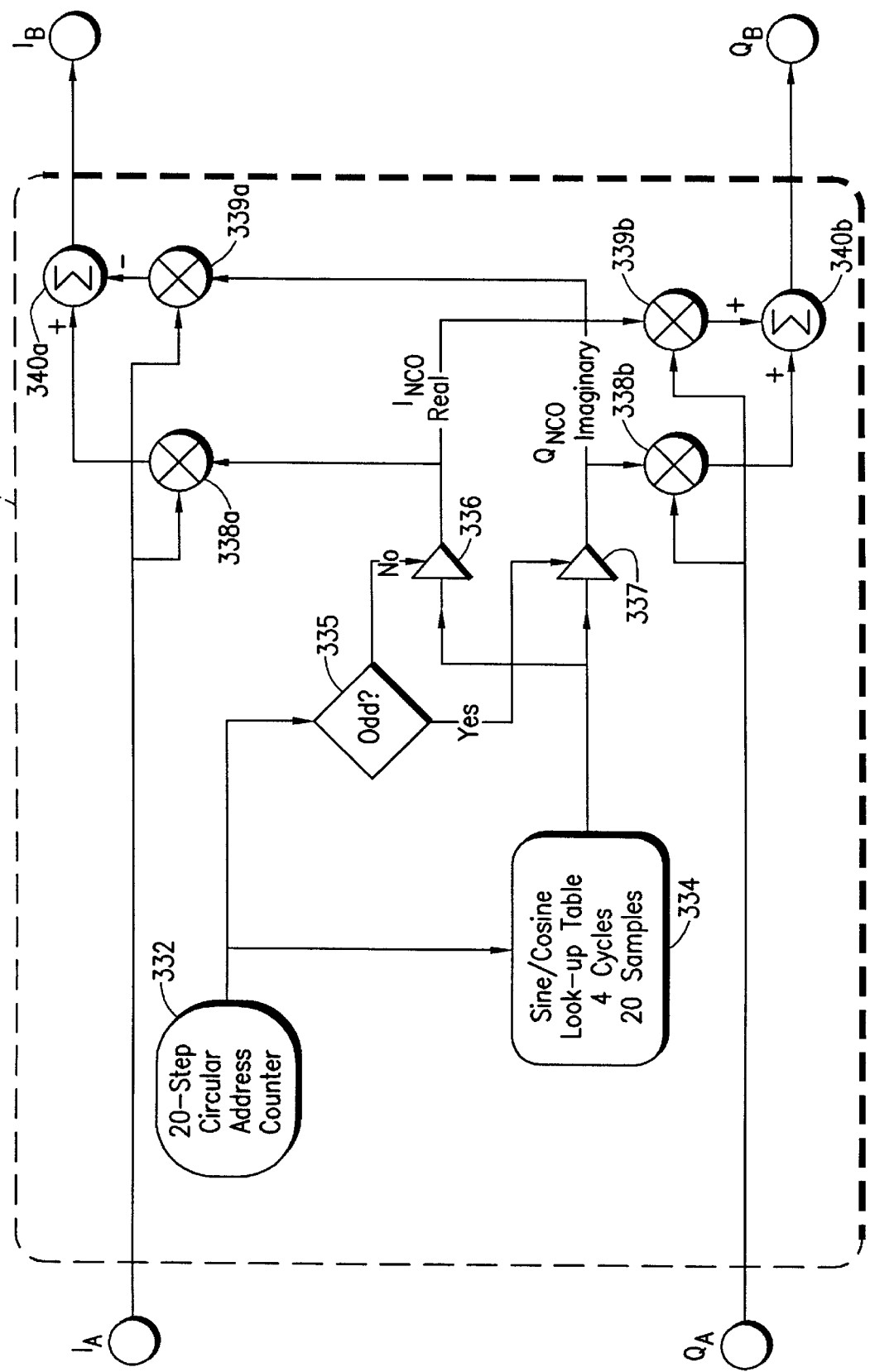
FIG. 5 is a schematic block diagram of the numerically controlled oscillator/modulator used in the digital signal processing section of FIG. 3.

Referring to FIG. 4, in the first digital filter 310 including the decimating FIR filters 310a and 310b, the sampled digital signal $IF_{75}$ is provided to an autobuffer feature 311 of the digital signal processor which allows input samples to be written to a buffer memory without interrupting the execution of the DSP code. When the autobuffer 311 is full, the DSP code will be interrupted and the contents of the autobuffer 311 will be processed.

The autobuffer 311 used in filters 310a and 310b holds eight input samples. The eight input samples are provided from the autobuffer 311 to a sixteen (16) sample filter delay line 312. The eight input samples from the autobuffer 311 replace the oldest eight input samples in the filter delay line 312. The DSP then performs a sum of products on the eight input samples and the previous eight input samples. This decimates the input sample rate by a factor of eight while filtering out the image of the real-valued input signal and undesired signals that would alias along with the desired alias. When the autobuffer 311 is full, the filter 310a produces a real output $I_A$ by multiplying the filter delay line samples by respective real coefficients 313a. The filter 310b produces an imaginary output $Q_B$ by summing the filter delay line samples weighted by respective imaginary coefficients 313b.

The coefficients 313a and 313b used in filter 310 are the result of a convolution of samples from two individual filters. The first filter is a Hilbert transform pair that rejects the image of the signal of interest. The second filter is a moving average modulated by a complex exponential signal. The frequency of this complex exponential signal is the frequency to which the moving average filter's frequency response is shifted. The modulated moving average rejects undesired aliases of the signal of interest after the decimation following filters 310a and 310b. The frequency responses of these two filters are cascaded into a signal filter by a convolution of the impulse responses of each individual filter.

The shifting frequency of the complex exponential signal is set slightly lower than the 75 kHz alias of the signal of interest. This flattens the passband of the cascaded frequency response of the DC offset correction section 305 and the first decimating filters 310a and 310b. The lowered shifting frequency also equalizes the stopband attenuation on the two sides of the passband. A desirable shifting frequency has been found to be 90% of the 75 kHz aliased signal of interest.

The 75 kHz input $IF_{75}$ to the filters 310a and 310b is aliased to $-18.75$ kHz after the 8:1 decimation. For the signal of interest to be filtered using lowpass filters, the aliased signal at $I_A$ and $Q_A$ needs to be shifted to baseband. This is done by NCOM 330, whose operation will now be described with reference to FIG. 5. The complex input signal is multiplied by a complex numerically controlled oscillator (NCO) signal having a frequency of $+18.75$ kHz. The product of the $-18.75$ kHz input signal and the $+18.75$ kHz NCO signal will be at baseband.

The complex NCO signal is generated by a sine look-up table 334. This look-up table 334 contains both the real and imaginary samples for four cycles of a complex exponential signal. The NCO frequency is obtained from the following formula:

NCO frequency=46.875 kHz sample rate×4 cycles/10 samples=18.75 kHz

The address to look-up table 334 is generated in a periodic fashion by a 20-step circular address counter 332. With each new complex sample, $I_A$ and $Q_A$, the counter will increment by two addresses. When the address reaches the end of the look-up table, it will reset to zero. Two outputs from the look-up table 334 are needed, one real and one imaginary. These outputs require two addresses, the second being one (1) sample greater than the first.

The first output of the look-up table 334 is provided to the real NCO output, $I_{NCO}$, through a gate 336. This gate is selected by a test node 335 if the offset is zero (even). If the offset is not zero (odd), test node 335 will direct the output of the look-up table to the imaginary NCO output, $Q_{NCO}$, through a gate 337.

The complex baseband outputs $I_B$ and $Q_B$ are produced from the product of the complex input signals $I_A$ and $Q_A$ and NCO signals $I_{NCO}$ and $Q_{NCO}$ according to the well known mathematical rule:

$$I_B + jQ_B = (I_A + jQ_A)(I_{NCO} + jQ_{NCO})$$

$$= I_A I_{NCO} + jI_A Q_{NCO} + jI_{NCO} Q_A + j^2 Q_A Q_{NCO}$$

$$= (I_A I_{NCO} - Q_A Q_{NCO}) + j(I_A Q_{NCO} + I_{NCO} Q_A)$$

The products $I_A I_{NCO}$ and $Q_A Q_{NCO}$, which produce the real output $I_B$ are implemented by multipliers 338a and 339a, respectively. The difference in the products is implemented by summing junction 340a. The products $I_A Q_{NCO}$ and $I_{NCO} Q_A$, which produce the imaginary output $Q_B$ are implemented by multipliers 338b and 339b, respectively. The sum of the products is implemented by summing junction 340b.

Figure 6:
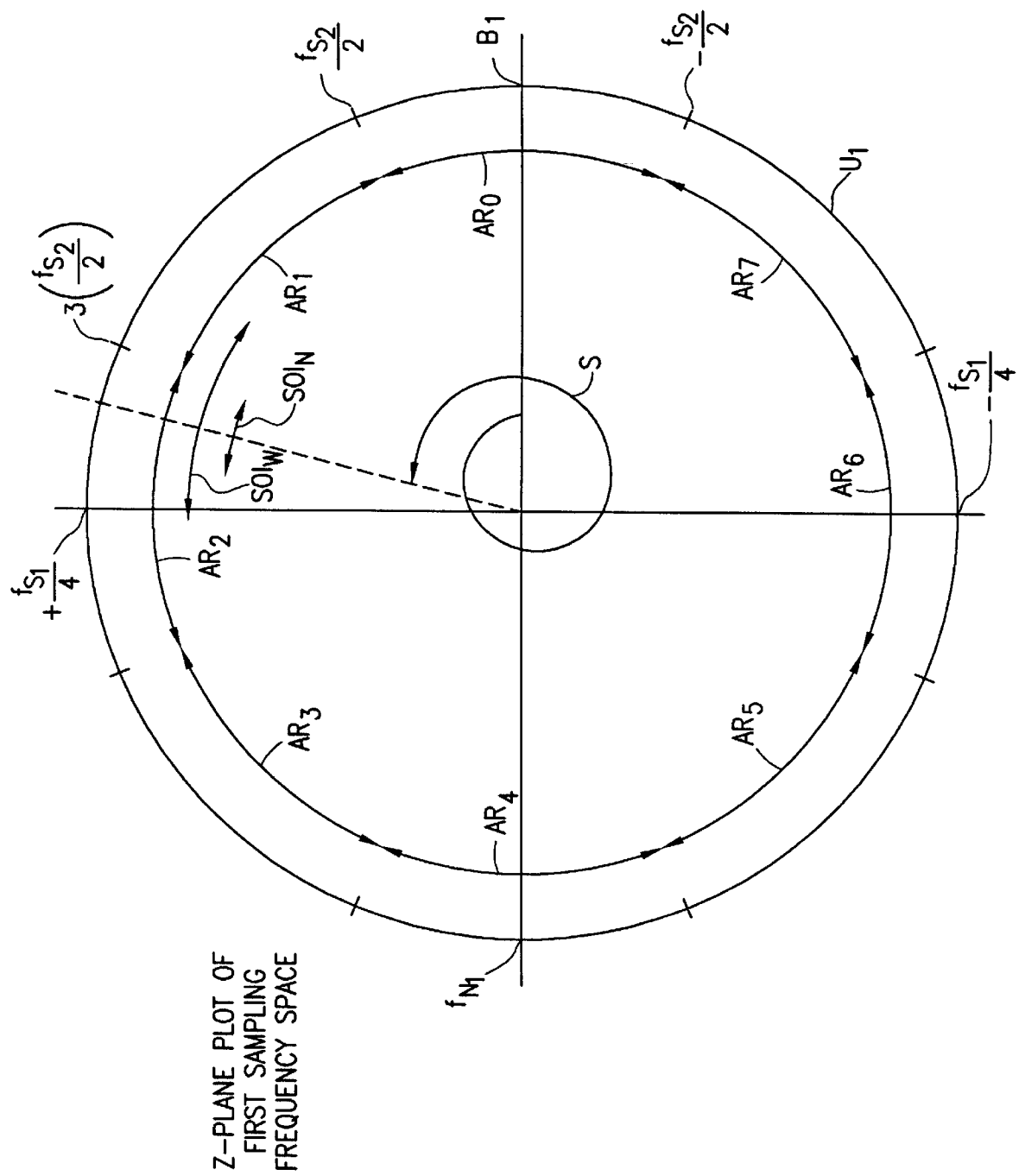
FIG. 6 is a Z-plane plot of a first sampling frequency space, showing how the signal bandwidth of interest lies within this space.

The frequency translation of the signal of interest to baseband will now be discussed, beginning with reference to FIG. 6. This is a plot of the z-plane frequency space created by the sampling of ADC 250. The periodic signals present at this ADC will be mapped onto the unit circle $U_1$, with zero frequency being the right most point $B_1$ on this circle, and the Nyquist limit the left most point $f_{N1}$.

The signal of interest $SOI_W$ or $SOI_N$ at tuning frequency $f_t$ is mapped onto this frequency space after one full rotation about the unit circle. The path taken by a signal whose frequency increases from baseband $B_1$ to the tuning frequency $f_t$ is shown by the spiral S. The full rotation of this spiral represents the aliasing of the signal of interest ($IF_{450}$) onto a lower frequency ($IF_{75}$) by the sampling of ADC 250.

The signal of interest undergoes further aliasing because it is decimated by a factor of eight in the first decimating filters 310a and 310b. This causes the unit circle $U_1$ to be divided into eight equal aliasing regions $AR_0$–$AR_7$, starting with a section $AR_0$ that straddles baseband $B_1$. A signal in any one of these aliasing regions will be mapped to a corresponding point within the baseband aliasing region $AR_0$. The signal of interest $SOI_W$ or $SOI_N$ straddles aliasing regions $AR_1$ and $AR_2$. When the signal is aliased by the decimation of filters 310a and 310b, it will appear at the edges of the baseband aliasing region $AR_0$.

Figure 7:
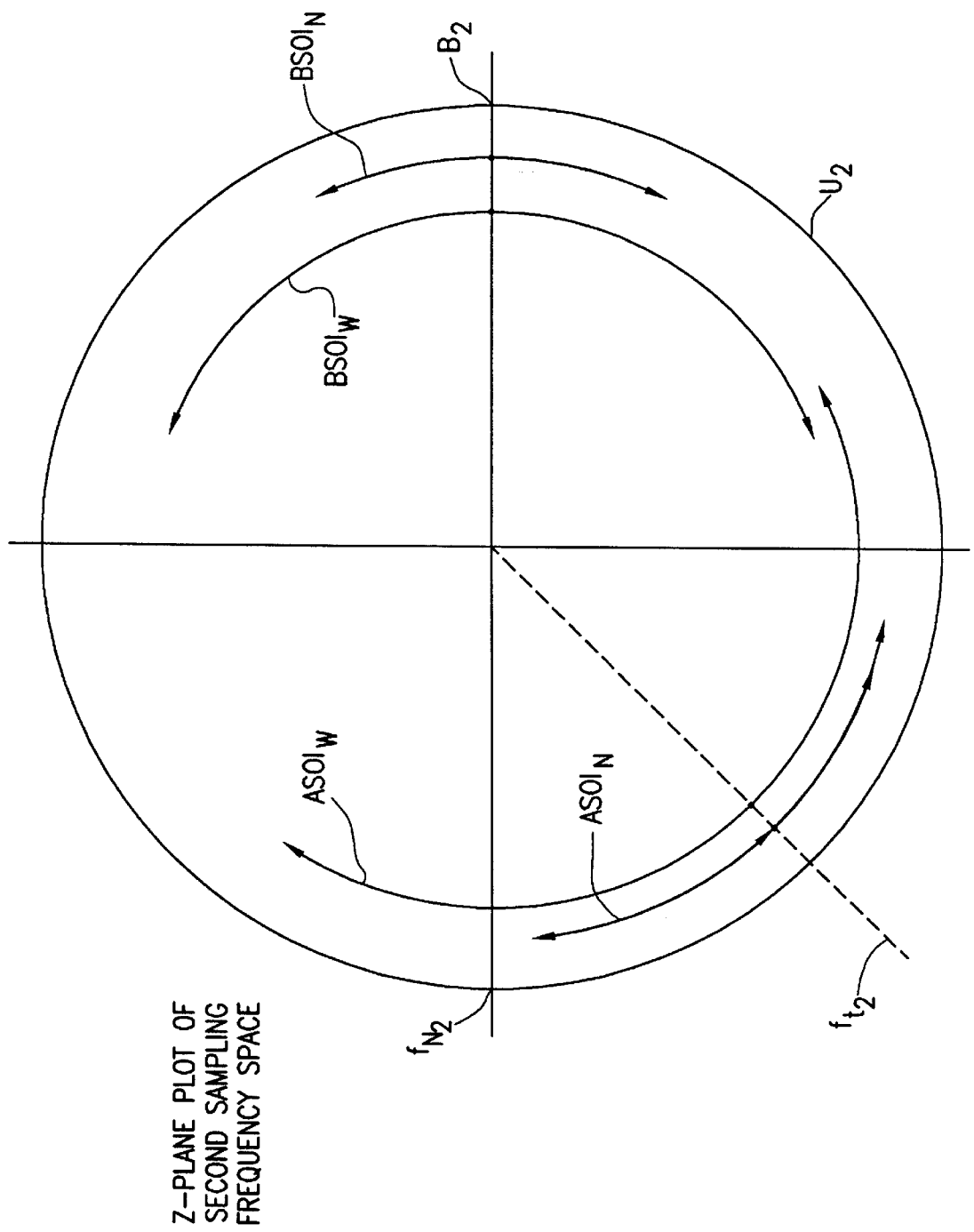
FIG. 7 is a Z-plane plot of a second sampling frequency space, showing how the signal bandwidth of interest has been selected and aliased into this smaller frequency space.

FIG. 7 shows the frequency space of aliasing region $AR_0$. This frequency space is formed by the edges of aliasing region $AR_0$ bending together into a smaller unit circle $U_2$. All signals in the larger frequency space of FIG. 6 alias into this smaller frequency space by the decimation of filters 310a and 310b.

As was previously mentioned, the aliased signal of interest straddles the edges of the baseband aliasing region $AR_0$. In this smaller unit circle $U_2$, these edges have come together and the signal is now represented by a continuous line segment $ASOI_W$ or $ASOI_N$. This signal almost straddles the Nyquist limit $f_{N2}$ of the lower sampling rate, and needs to be translated to baseband $B_2$. This is done by the NCOM 330, described herein with respect to FIG. 5. After complex mixing by the NCOM, the signal of interest $BSOI_W$ or $BSOI_N$ straddles baseband $B_2$ and is ready to be lowpass filtered for additional receiver selectivity.

Figure 8:
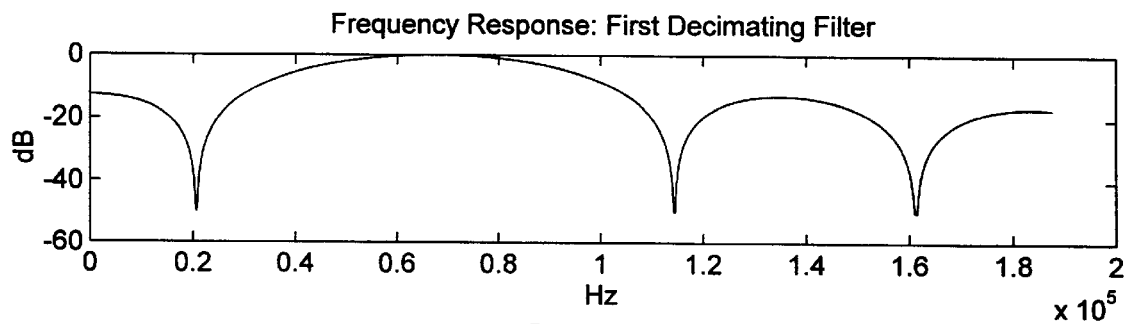
FIGS. 8, 9, and 10 show plots of the simulated frequency responses of the first decimating filter and the wide and narrow channel filters across the Nyquist bandwidth of the input sample rate, respectively.
Figure 9:
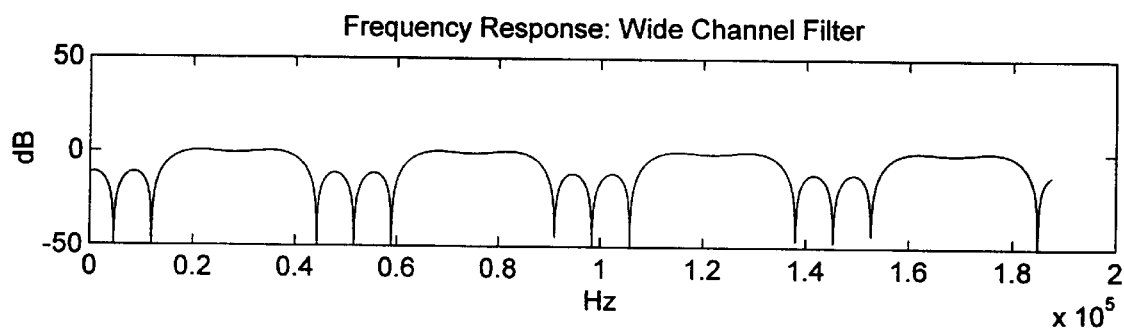
Figure 10:
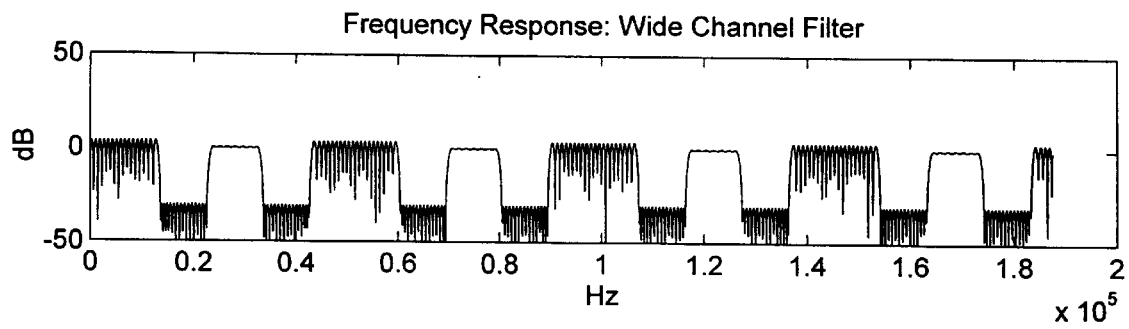

FIGS. 8, 9 and 10 show simulated frequency response plots of the first decimating filter, and the wide and narrow channel filters, respectively. The frequency span of these plots is the Nyquist bandwidth of the input sample rate, extending from $-187.5$ kHz to 187.5 kHz. The first decimating filter frequency response, shown in FIG. 8, has a null at each frequency which would alias into the same frequency as the signal of interest. A null region is also present at the image of the signal of interest. A simple and efficient filter is used to provide a limited amount of stopband rejection for reduction of aliased noise and to reject the image of the real valued input signal.

The coefficients of this filter are obtained from MAT-LAB® code (obtained from MATLAB® signal processing software available from The MathWorks, Natick, Mass.) disclosed in the following table:

```
fs1 = 375E3;     % Input sampling rate
ft = 75E3;       % shifting frequency
% First decimating filter 310a and 310b
N = 16;
% Number of filter taps
N1 = 8;
N2 = N - N1:
% Hilbert transform pair
b1 = remez(N2,[0.9*ft 1.1*ft]/(fs1/2),[1 1],'Hilbert');
b1 = [zeros(1,N2/2) 1 zeros(1,N2/2)] + j*b1;
% Modulated moving average
b2 = exp(j*2*pi*ft/fs1*(1:N1));
b2 = b2 ./N;
b = conv(b1,b2);
```

FIG. 9 shows the simulated frequency response of the wide channel filter. The stopband is very loosely defied, providing just enough stopband attenuation to limit the noise generated after the analog filters which falls outside the passband of interest. A tightly defined stopband is not needed for the wide channel filter because the analog filtering will have already defined the wide-bandwidth selectivity of the signal by the time it reaches the wide channel filter. Thus a simple and efficient filter may be used.

This frequency response was obtained from an eight-tap FIR filter. The coefficients of this filter were designed using the Remez exchange algorithm, available in the MATLAB® Signals & Systems Toolbox, with the passband weight given four times the constraint of the stopband.

FIG. 10 shows the simulated frequency response of the narrow channel filter. This filter needs to define the adjacent channel selectivity of a narrow bandwidth signal because these adjacent channels fall within the passband of analog filtering. The stopband of the narrow channel filter can be less tightly constrained at the beginning of the wide channel filter stopband. At this point, the preceding analog filter, first decimating filter, and wide channel filter provide the attenuation of undesired signals.

This frequency response was realized from a 64-tap FIR filter. The stopband of this filter is less tightly constrained after the beginning of the wide channel filter stopband, as described above. The coefficients of this filter are obtained from the MATLAB® code disclosed in the following table:

```
fs1 = 375E3;          % Input sampling rate
fs2 = fs1/8;          % Decimated sampling rate
fbww = 9E3;           % Half of wide bandwidth of interest
fstw = fs2/2 - fbww;  % Lower edge of wide channel stopband
fbwn = 3.5E3;         % Half of narrow bandwidth of interest
fcsn = 10E3;          % Narrow bandwidth channel spacing
fslop = 800;          % Frequency slop
fstn = fcsn - fbwn - fslop;  % Lower edge of narrow channel stopband
fbwn = fbwn + fslop;  % Adjust passband for slop
% Design narrow channel LPF 410a and 410b FIR using Remez exchange
N = 64;               % Number of filter taps
% Define frequency bands for Remez exchange FIR
sep = 1E3;
f = [0 fbwn fstn fstw fstw + sep (fs2/2)] ./ (fs2/2);
M = [1 1 0 0 0 0 ];   % Magnitudes
W = [1 1 0.02 ];      % Weights
% Calculate FIR coefficients with Remez exchange
b = remez(N - 1,f,M,W);
```

While an FIR implementation of the narrow channel filter is preferred, an IIR filter may also be used. Obviously, no narrow channel filter is used at all in an embodiment having only a single bandwidth.

Figure 11:
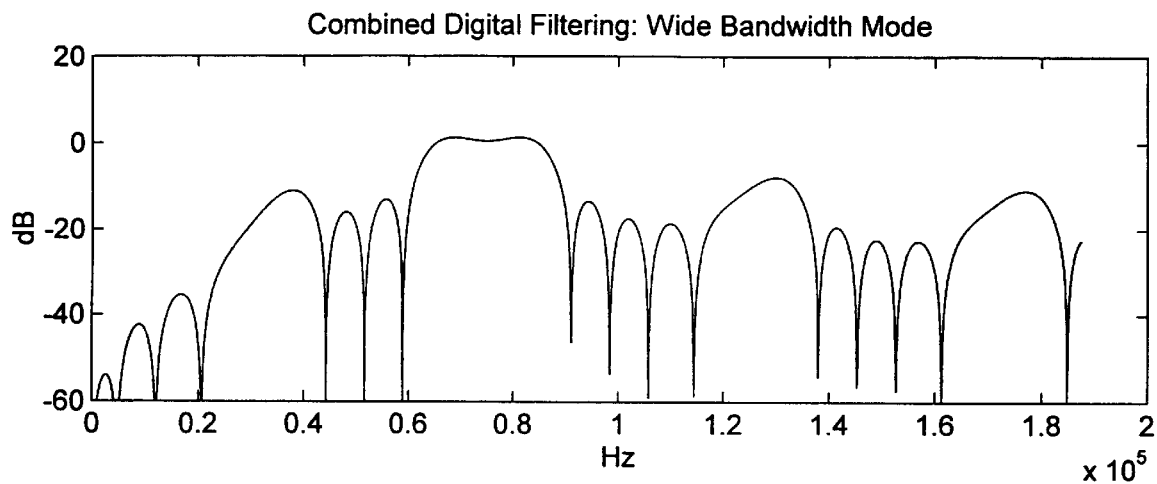
FIGS. 11 and 12 show the simulated frequency response of the combined digital filtering with decimation for wide and narrow modes of operation, respectively.
Figure 12:
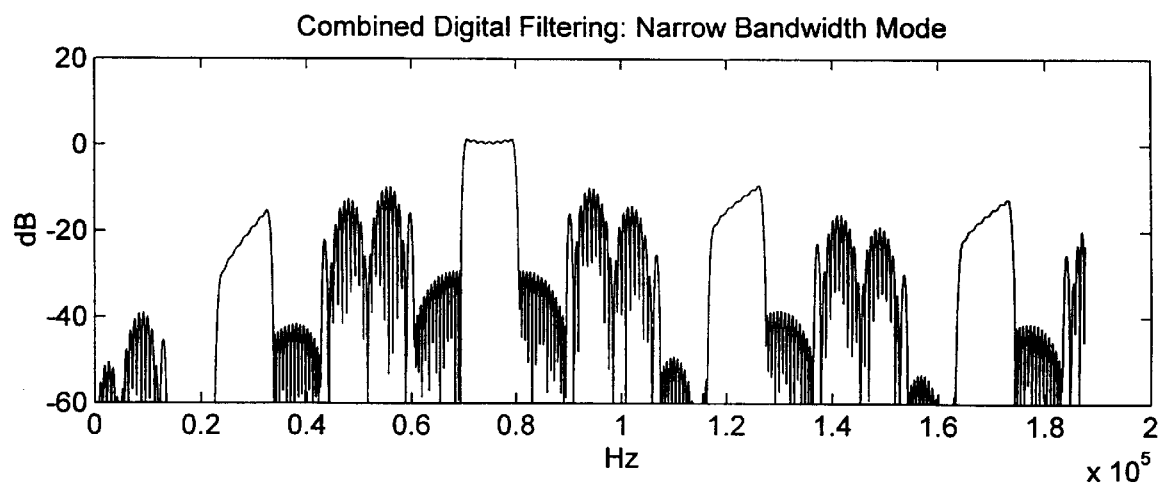
Figure 13:
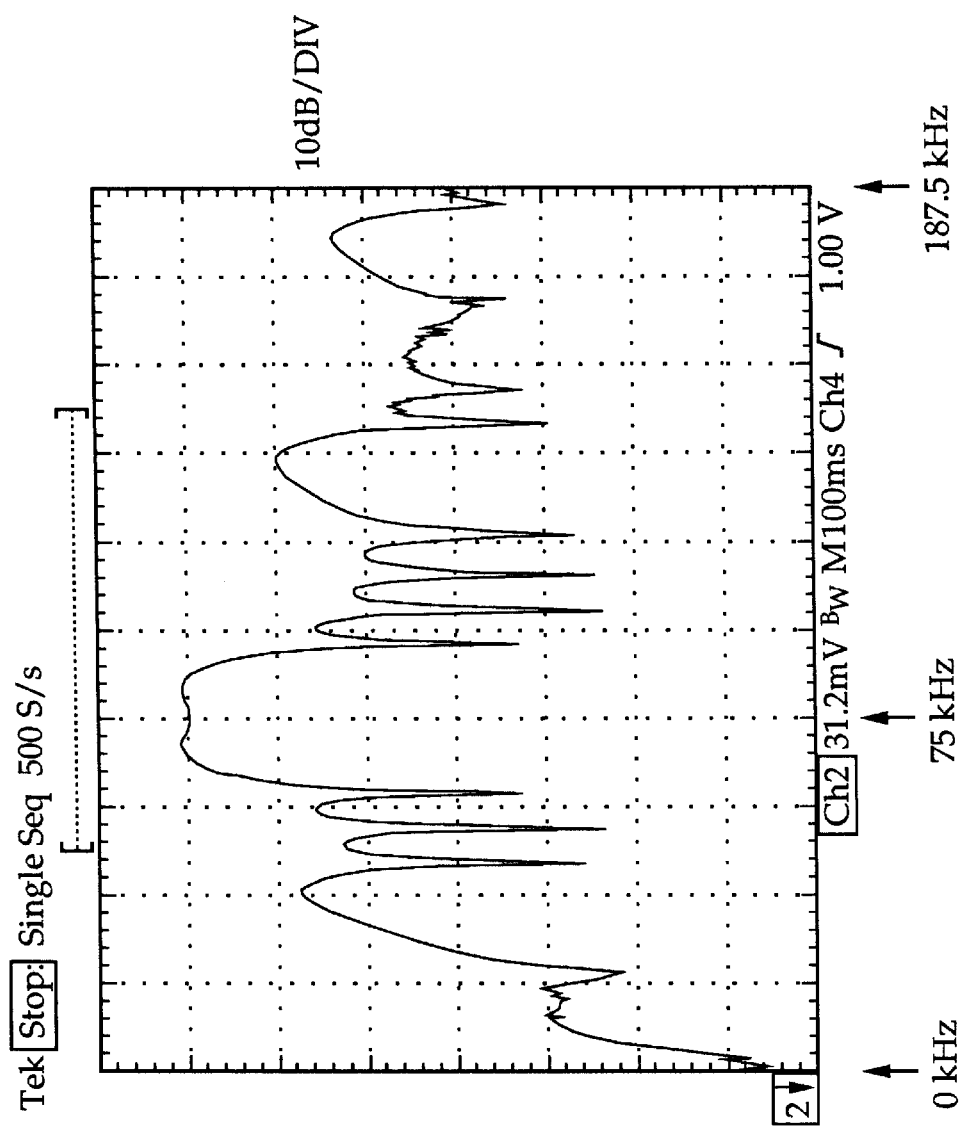
FIGS. 13 and 14 show the frequency response of the combined digital filtering with decimation for wide and narrow modes of operation, respectively, for a prototype receiver utilizing the filtering of the present invention.
Figure 14:
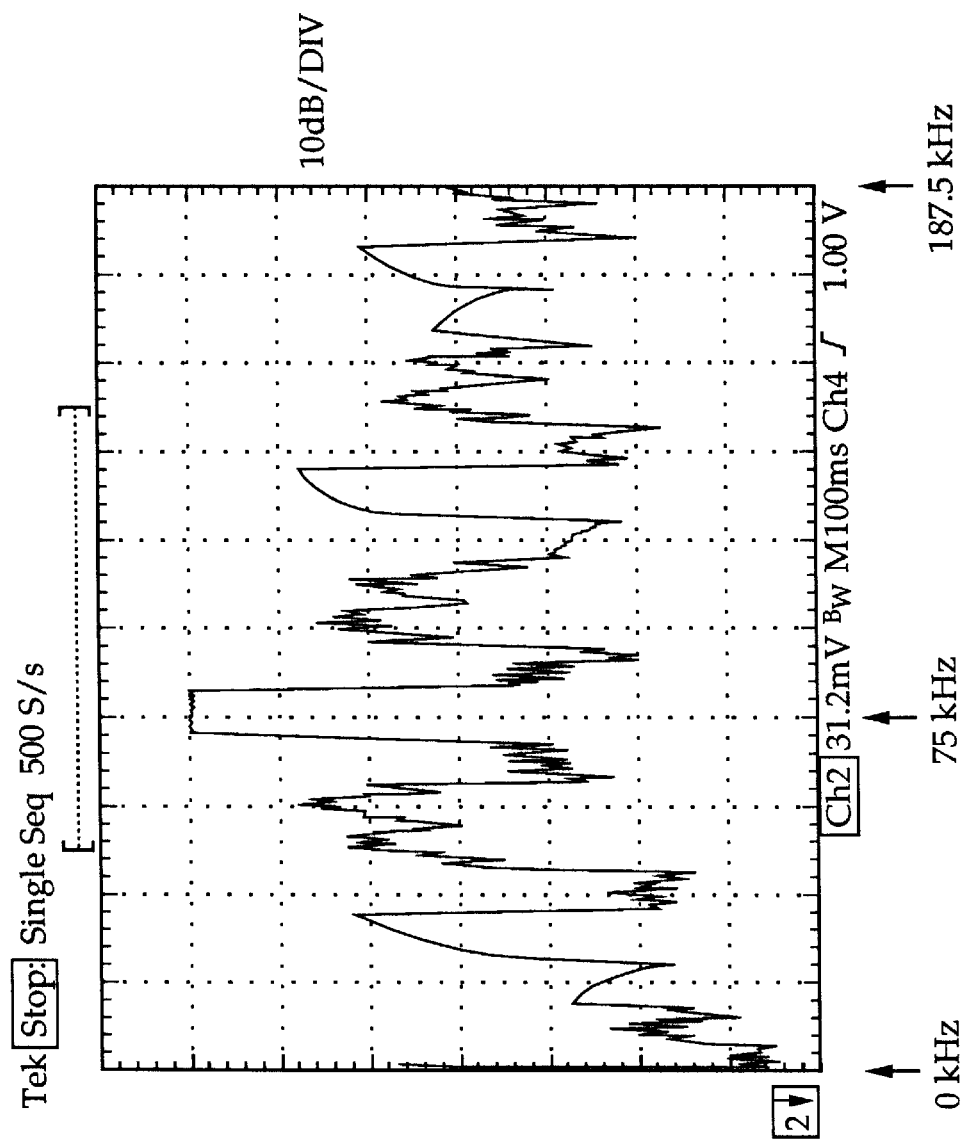

FIGS. 11 and 12 show the simulated frequency response of the combined digital filtering with decimation for wide and narrow modes of operation, respectively. FIGS. 13 and 14 show the frequency response of the combined digital filtering with decimation for wide and narrow modes of operation, respectively, for a prototype receiver utilizing the digital filtering of the present invention. In the wide bandwidth mode of this example, approximately 15 to 20 dB of attenuation is provided by the digital filtering. In contrast, approximately 50 dB of attenuation is provided by the analog filtering. The overall attenuation provided by the receiver may be designed to meet a desired specification, such as the specification for a radio receiver in a cellular telephone base site, specification IS-20A. This specification includes a requirement of 60 dB of rejection beyond the adjacent channel.

Figure 15:
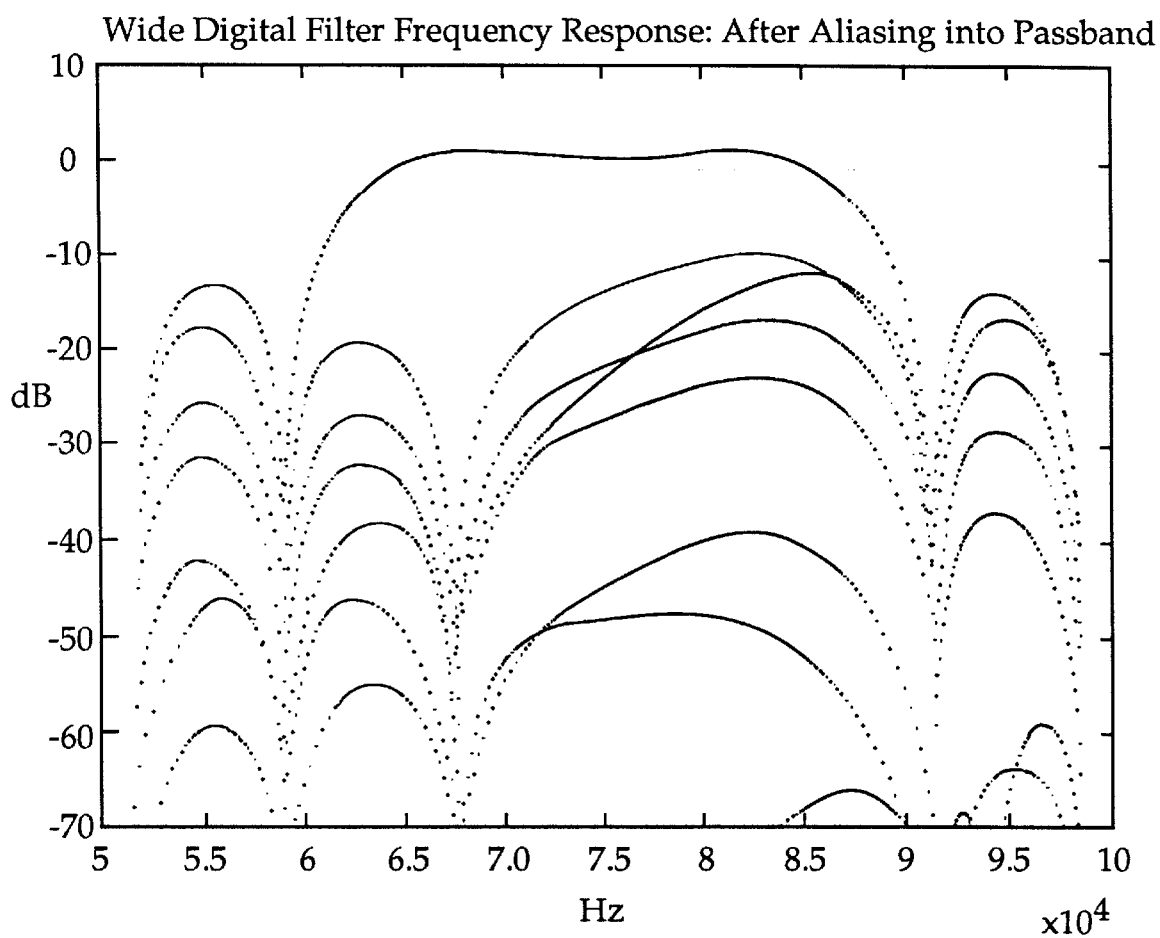
FIG. 15 shows the simulated frequency response of the wide-bandwidth digital filtering after aliasing into the decimated frequency space.

FIG. 15 shows the simulated frequency response of the digital filtering in the wide bandwidth mode of operation after aliasing. The aliased noise is attenuated but not fully rejected by the digital filtering. The sum of all aliased noise only slightly degrades the overall noise figure of the receiver.

The clock frequencies for the switched-capacitor lowpass filter, pseudorandom number generator, ADC sampling, and ADC serial clocking are preferably obtained by dividing down the DSP clock frequency. This DSP clock is preferably obtained from the same oscillator that provides the frequency standards for downconverter 100. A DSP clock frequency of 24.000 MHz has been found to serve well for this purpose.

While the embodiment described above uses a 450 kHz IF frequency before the ADC 250, another common IF frequency such as 455 kHz may also be used. The invention is not limited to any particular IF frequency. The 450 kHz frequency was described simply because it enabled the use of an auxiliary synthesizer to act as the local oscillator 130. This auxiliary synthesizer is a feature of an SA7025 synthesizer IC which may be used in the downconverter 100.

While the invention has been described above with respect to a preferred embodiment, it will be obvious to one of ordinary skill in the art that a receiver conforming to the spirit and scope of the invention may be constructed in ways other than that described herein. In particular, discrete-time frequency translation and filtering may be accomplished with many known DSP architectures other than that described above while still retaining the benefits of the invention. Thus, the invention is to be considered as limited only by the scope of the appended claims.

What is claimed is:

1. A radio receiver for receiving radio frequency signals, the radio receiver having a wideband channel selectivity and a narrowband channel selectivity, corresponding respectively to a wide bandwidth mode of operation and a narrow bandwidth mode of operation, comprising:

analog down-converting and filtering means, having a passband and a stopband which in combination substantially determine the wide bandwidth mode of operation of the radio receiver, said analog down-converting and filtering means responsive to the received radio frequency signals, for selecting and down-converting the received radio frequency signals to an intermediate frequency signal within the passband;

an analog-to-digital converter, responsive to said intermediate frequency signal, for converting said intermediate frequency signal to a sampled digital signal;

wideband digital filtering means, responsive to said sampled digital signal, for providing wide bandwidth baseband quadrature output signals for the wide bandwidth of operation;

narrowband digital filtering means, responsive to said wide bandwidth baseband quadrature output signals, for providing narrow bandwidth baseband quadrature output signals for the narrow bandwidth mode of operation; and wherein said analog down-converting and filtering means provides the majority of the radio receiver wideband channel selectivity, thereby providing more than half of the signal attenuation for received radio frequency signals outside of the passband.

2. A radio receiver as claimed in claim 1, wherein said analog down-converting and filtering means includes:

a first analog filtering stage having a bandwidth equal to the wide bandwidth mode of operation of the receiver; and a second analog filtering stage following said first analog filtering stage, said second analog filtering stage having a bandwidth and frequency response such that the combined frequency response of said first and second analog filtering stages substantially define said passband and said stopband for the wide bandwidth mode of operation.

3. A radio receiver as claimed in claim 2, wherein a center frequency of said second analog filtering stage is 455 kHz.

4. A radio receiver as claimed in claim 2, wherein a center frequency of said second analog filtering stage is 450 kHz.

5. A radio receiver as claimed in claim 2, wherein said wideband digital filtering means comprises:

a first digital filtering stage, responsive to said sampled digital signal, for providing quadrature-related output signals;

a numerically controlled oscillator and modulator, responsive to said quadrature-related output signals, for shifting a frequency of said quadrature-related output signals to baseband, thereby providing baseband quadrature signals; and a pair of wide channel low pass filters, each responsive to a respective one of said baseband quadrature signals, for providing said wide bandwidth baseband quadrature output signals.

6. A radio receiver as claimed in claim 5, wherein said first digital filtering stage implements:

a moving average having unity weighting coefficients which have been modulated by a complex exponential to thereby shift a center frequency of said first digital filtering stage from baseband to a center frequency of a signal of interest; and rejection of the image of a real-valued input signal to said first digital filtering stage.

7. A radio receiver as claimed in claim 6, wherein said narrowband digital filtering means includes a pair of narrow channel low pass filters, each responsive to a respective one of said wide bandwidth baseband quadrature output signals, for providing said narrow bandwidth baseband quadrature output signals.

8. A radio receiver as claimed in claim 7, wherein said narrow and wide channel low pass filters are selectively replaceable for modifying said narrow bandwidth mode of operation and said wide bandwidth mode of operation, respectively.

9. A radio receiver as claimed in claim 5, wherein said narrowband digital filtering means includes a pair of narrow channel low pass filters, each responsive to a respective one of said wide bandwidth baseband quadrature output signals, for providing said narrow bandwidth baseband quadrature output signals.

10. A radio receiver as claimed in claim 9, wherein said narrow and wide channel low pass filters are selectively replaceable for modifying said narrow bandwidth mode of operation and said wide bandwidth mode of operation, respectively.

11. A radio receiver as claimed in claim 1, wherein the closest alias of said sampled digital signal is separated from said frequency range of interest by a plurality of analog filter bandwidths.

12. A radio receiver for receiving radio frequency signals, the radio receiver having a wideband channel selectivity and a narrowband channel selectivity, corresponding to a wide bandwidth mode of operation and a narrow bandwidth mode of operation, comprising:

analog down-converting and filtering means, responsive to the received radio frequency signals, having a passband and a stopband which in combination substantially determine the wide bandwidth mode of operation of the radio receiver, said analog down-converting and filtering means for selecting and down-converting the received radio frequency signals to an intermediate frequency signal within the passband;

an analog-to-digital converter, responsive to said intermediate frequency signal, for converting said intermediate frequency signal to a sampled digital signal;

wideband digital filtering means, responsive to said sampled digital signal, for providing wide bandwidth baseband quadrature output signals for the wide bandwidth mode of operation, said wideband digital filtering means comprising:

a first digital filtering stage, responsive to said sampled digital signal, for providing quadrature-related output signals;

a numerically controlled oscillator and modulator, responsive to said quadrature-related output signals, for shifting a frequency of said quadrature-related output signals to baseband, thereby providing baseband quadrature signals; and a pair of wide channel low pass filters, each responsive to a respective one of said baseband quadrature signals, for providing said wide bandwidth baseband quadrature output signals; and narrowband digital filtering means, responsive to said wide bandwidth baseband quadrature output signals, for providing narrow bandwidth baseband quadrature output signals for a narrow bandwidth mode of operation.

13. A radio receiver as claimed in claim 12, wherein said first digital filtering stage implements:

a moving average having unity weighting coefficients which have been modulated by a complex exponential to thereby shift a center frequency of said first digital filtering stage from baseband to a center frequency of a signal of interest; and rejection of the image of a real-valued input signal to said first digital filtering stage.

14. A radio receiver as claimed in claim 13, wherein said narrowband digital filtering means includes a pair of narrow channel low pass filters, each responsive to a respective one of said wide bandwidth baseband quadrature output signals, for providing said narrow bandwidth baseband quadrature output signals.

15. A radio receiver as claimed in claim 14, wherein said narrow and wide channel low pass filters are selectively replaceable for modifying said narrow bandwidth mode of operation and said wide bandwidth mode of operation, respectively.

16. A radio receiver as claimed in claim 12, wherein said narrowband digital filtering means includes a pair of narrow channel low pass filters, each responsive to a respective one of said wideband baseband quadrature output signals, for providing said narrow bandwidth baseband quadrature output signals.

17. A radio receiver as claimed in claim 16, wherein said narrow and wide channel low pass filters are selectively replaceable for modifying said narrow bandwidth mode of operation and said wide bandwidth mode of operation, respectively.

18. A radio receiver for receiving radio frequency signals, the radio receiver having a wideband channel selectivity corresponding to a wide bandwidth mode of operation, comprising:

analog down-converting and filtering means, having a passband and a stopband which in combination substantially determine the wide bandwidth mode of operation of the radio receiver, said analog down-converting and filtering means responsive to the received radio frequency signals, for selecting and down-converting the received radio frequency signals to an intermediate frequency signal within the passband, said analog down-converting and filtering means providing the majority of the radio receiver wideband channel selectivity thereby providing more than half of the signal attenuation for received radio frequency signals outside of the passband;

an analog-to-digital converter, responsive to said intermediate frequency signal, for converting said intermediate frequency signal to a sampled digital signal;

a selectively replaceable digital filter, responsive to said sampled digital signal, for providing output signals in a selected channel bandwidth, said selected channel bandwidth being determined by a selection of a selectively replaceable digital filter having said selected channel bandwidth.

19. A radio receiver as claimed in claim 18, wherein each said selectively replaceable digital filter comprises:

a first digital filtering stage, responsive to said sampled digital signal, for providing quadrature-related output signals;

a numerically controlled oscillator and modulator, responsive to said quadrature-related output signals, for shifting a frequency of said quadrature-related output signals to baseband, thereby providing baseband quadrature signals; and a pair of selectively replaceable low pass filters, each responsive to a respective one of said baseband quadrature signals, for providing said output signals as quadrature output signals.

20. A radio receiver as claimed in claim 18, wherein said selectively replaceable digital filter comprises:

a wideband digital filter, responsive to said sampled digital signal, for providing wide bandwidth output signals for a wide bandwidth mode of operation; and a narrowband digital filter, responsive to said wide bandwidth output signals, for providing narrow bandwidth output signals for a narrow bandwidth mode of operation.

21. A receiver that performs both analog and digital filtering of received radio frequency signals for determining a channel selectivity of the receiver, the receiver having a wideband channel selectivity and a narrowband channel selectivity, corresponding to a wide bandwidth mode of operation and a narrow bandwidth mode of operation, the receiver comprising:

analog filtering means having a passband and a stopband which in combination substantially determine the wide bandwidth mode of operation of the receiver, said analog filtering means responsive to the received radio frequency signals, and for providing the majority of the receiver wideband channel selectivity, thereby providing more than half of the signal attenuation for received signals outside of the passband, for substantially determining the channel selectivity of the wide bandwidth mode of operation of the receiver; and digital filtering means which compensates for imperfections in the analog filtering means and limits a noise amplitude of noise generated after analog filtering by the analog filtering means which would alias into the passband. for selecting and down-converting the received radio frequency signals to intermediate frequency signal within the passband.

22. A receiver as claimed in claim 21, wherein said analog filtering means includes a plurality of analog filtering stages, and wherein a center frequency of a last analog filtering stage is 455 kHz.

23. A receiver as claimed in claim 21, wherein said analog filtering means includes a plurality of analog filtering stages, and wherein a center frequency of a last analog filtering stage is 450 kHz.

24. A receiver as claimed in claim 21, wherein said digital filtering means includes a plurality of digital filtering stages, and wherein a first digital filtering stage implements a moving average whose unity weighting coefficients have been modulated by a complex exponential so as to shift a center frequency of said digital filtering means from baseband to a center frequency of a signal of interest.

25. A radio receiver as claimed in claim 12, wherein the closest alias of said sampled digital signal is separated from said frequency range of interest by a plurality of analog filter bandwidths.

* * * * *

UNITED STATES PATENT AND TRADEMARK OFFICE
CERTIFICATE OF CORRECTION

PATENT NO : 5,926,513

DATED : July 20, 1999

INVENTOR(S) : Suominen et al.

It is certified that error appears in the above-identified patent and that said Letters Patent is hereby corrected as shown below:

Drawings:

Figure 10 "Wide Channel Filter" should be --Narrow Channel Filter--.

In the abstract, line 3, after "intermediate", --frequency signal within a-- should be inserted.

At column 14, lines 32-34 (claim 21) "for selecting and down-converting the received radio frequency signals to an intermediate frequency signal within the passband" should be moved up to line 22 after "signals".

Signed and Sealed this

Seventh Day of March, 2000

Attest:

Attesting Officer

Q. TODD DICKINSON

Commissioner of Patents and Trademarks